(12) United States Patent
Park et al.

(10) Patent No.: US 8,970,553 B2
(45) Date of Patent: Mar. 3, 2015

(54) LIGHT SENSING CIRCUIT, AND REMOTE OPTICAL TOUCH PANEL AND IMAGE ACQUISITION APPARATUS INCLUDING THE LIGHT SENSING CIRCUIT

(75) Inventors: Sung-ho Park, Yongin-si (KR); I-hun Song, Seongnam-si (KR); Chang-jung Kim, Yongin-si (KR); Sang-hun Jeon, Yongin-si (KR); Seung-eon Ahn, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 380 days.

(21) Appl. No.: 12/926,922

(22) Filed: Dec. 17, 2010

(65) Prior Publication Data
US 2011/0261017 A1    Oct. 27, 2011

(30) Foreign Application Priority Data
Apr. 22, 2010   (KR) .................... 10-2010-0037531

(51) Int. Cl.
*G06F 19/00*    (2011.01)
*H01L 27/146*   (2006.01)
(Continued)

(52) U.S. Cl.
CPC .... *H01L 27/14681* (2013.01); *H01L 27/14609* (2013.01); *G09G 3/3648* (2013.01);
(Continued)

(58) Field of Classification Search
CPC . G09G 3/3406; G09G 3/3648; G09G 3/3696; G09G 2320/043; G09G 2320/0626; H01L 27/14609; H04N 5/3745
USPC ................ 345/175, 179; 178/18.09; 250/200, 250/208.1, 208.6, 214.1; 257/225, 227, 257/228, 431, 432, 444, 446, 447, 448, 257/E31.079, E31.082, E31.091, E31.095, 257/E31.096, 80, 84; 313/507; 315/169.3; 347/236; 365/14, 18, 24, 112, 185.3; 349/42; 702/85, 104

See application file for complete search history.

(56) References Cited

U.S. PATENT DOCUMENTS 7,504,616 B2 *   3/2009   Nakamura et al. ......... 250/214.1
7,863,611 B2 *   1/2011   Abe et al. ........................ 257/58
(Continued)

FOREIGN PATENT DOCUMENTS

EP   2 341 542 A2    7/2011
JP   2007-316196     12/2007
(Continued)

OTHER PUBLICATIONS

European Search Report dated Nov. 20, 2012 for Application No. 12177721.3-2203.
(Continued)

*Primary Examiner* — Michael J Eurice
(74) *Attorney, Agent, or Firm* — Harness, Dickey & Pierce

(57) ABSTRACT

Example embodiments are directed to light sensing circuits having a relatively simpler structure by using light-sensitive oxide semiconductor transistors as light sensing devices, and remote optical touch panels and image acquisition apparatuses, each including the light sensing circuits. The light sensing circuit includes a light-sensitive oxide semiconductor transistor in each pixel, wherein the light-sensitive oxide semiconductor transistor is configured as a light sensing device, and a driving circuit that outputs data. The light sensing circuit may have a relatively simple circuit structure including a plurality of transistors in one pixel. As a result, the structure and operation of the light sensing circuit may be simplified.

19 Claims, 7 Drawing Sheets

(51) Int. Cl.

| | | |
|---|---|---|
| *G09G 3/36* | (2006.01) | |
| *H04N 5/3745* | (2011.01) | |
| *G09G 3/34* | (2006.01) | |
| *G01J 1/44* | (2006.01) | |
| *G06F 3/0354* | (2013.01) | |
| *G06F 3/038* | (2013.01) | |
| *G06F 3/041* | (2006.01) | |
| *H01L 27/12* | (2006.01) | |
| *H01L 31/113* | (2006.01) | |

(52) U.S. Cl.
CPC ........... *G09G3/3696* (2013.01); *H04N 5/3745* (2013.01); *G09G 3/3406* (2013.01); *G09G 2320/0626* (2013.01); *G09G 2320/043* (2013.01); *G01J 1/44* (2013.01); *G06F 3/03542* (2013.01); *G06F 3/03545* (2013.01); *G06F 3/0386* (2013.01); *G06F 3/0412* (2013.01); *H01L 27/1225* (2013.01); *H01L 31/1136* (2013.01)
USPC ............... 345/175; 345/179; 349/42; 702/85; 702/104

(56) References Cited

U.S. PATENT DOCUMENTS

| | | | | |
|---|---|---|---|---|
| 8,106,983 | B2* | 1/2012 | Hirota et al. ............... | 348/308 |
| 8,194,469 | B2* | 6/2012 | Tanaka et al. .............. | 365/185.3 |
| 2005/0200293 | A1* | 9/2005 | Naugler et al. ............. | 315/149 |
| 2006/0113565 | A1* | 6/2006 | Abe et al. .................... | 257/197 |
| 2006/0244693 | A1* | 11/2006 | Yamaguchi et al. ........ | 345/76 |
| 2006/0262055 | A1* | 11/2006 | Takahara ..................... | 345/81 |
| 2006/0267948 | A1* | 11/2006 | Takahashi ................... | 345/168 |
| 2007/0235741 | A1* | 10/2007 | Nakamura et al. .......... | 257/79 |
| 2007/0252147 | A1* | 11/2007 | Kim et al. ................... | 257/59 |
| 2007/0272922 | A1* | 11/2007 | Kim et al. ................... | 257/43 |
| 2008/0066972 | A1* | 3/2008 | Abileah et al. ............. | 178/18.09 |
| 2008/0074401 | A1* | 3/2008 | Chung et al. ............... | 345/175 |
| 2008/0122803 | A1* | 5/2008 | Izadi et al. .................. | 345/175 |
| 2008/0122804 | A1* | 5/2008 | Kinoshita et al. ........... | 345/175 |
| 2008/0211786 | A1* | 9/2008 | Park et al. ................... | 345/175 |
| 2009/0086137 | A1* | 4/2009 | Horiguchi et al. ........... | 349/116 |
| 2009/0153708 | A1* | 6/2009 | Hirota et al. ................ | 348/294 |
| 2009/0161051 | A1* | 6/2009 | Fukunaga et al. ........... | 349/115 |
| 2009/0248344 | A1* | 10/2009 | Hirabayashi et al. ........ | 702/85 |
| 2010/0020044 | A1* | 1/2010 | Abileah et al. .............. | 345/175 |
| 2010/0060611 | A1* | 3/2010 | Nie ............................. | 345/175 |
| 2010/0090996 | A1* | 4/2010 | Chou et al. .................. | 345/207 |
| 2010/0097838 | A1 | 4/2010 | Tanaka et al. | |
| 2011/0057185 | A1* | 3/2011 | Peng et al. .................. | 257/43 |
| 2011/0141060 | A1 | 6/2011 | Kim et al. | |
| 2011/0261017 | A1 | 10/2011 | Park et al. | |

FOREIGN PATENT DOCUMENTS

| | | |
|---|---|---|
| JP | 2009-244638 | 10/2009 |
| JP | 2010-014719 | 1/2010 |
| JP | 2010-056303 | 3/2010 |
| KR | 10-2002-017778 | 3/2002 |
| KR | 10-2002-017781 | 3/2002 |
| KR | 10-2008-066150 | 7/2008 |
| KR | 10-2010-107058 | 10/2010 |
| WO | WO 2007/120010 | 10/2007 |
| WO | WO 2009-096608 | 8/2009 |

OTHER PUBLICATIONS

Office Action for corresponding U.S. Appl. No. 13/545,623 dated Aug. 25, 2014.

* cited by examiner

LIGHT SENSING CIRCUIT, AND REMOTE OPTICAL TOUCH PANEL AND IMAGE ACQUISITION APPARATUS INCLUDING THE LIGHT SENSING CIRCUIT

CROSS-REFERENCE TO RELATED APPLICATION

This application claims priority under 35 U.S.C. §119 to Korean Patent Application No. 10-2010-0037531, filed on Apr. 22, 2010, in the Korean Intellectual Property Office, the disclosure of which is incorporated herein in its entirety by reference.

BACKGROUND

1. Field

Example embodiments relate to light sensing circuits, and remote optical touch panels and image acquisition apparatuses each including the light sensing circuits, and more particularly, to light sensing circuits having a relatively simple circuit and including light-sensitive oxide semiconductor transistors as light sensing devices, and remote optical touch panels and image acquisition apparatuses each including the light sensing circuits.

2. Description of the Related Art

Touch screens are devices which allow a user to receive data on a screen by touching the screen with, for example, a finger, a pen, a stylus or the like, thereby allowing the user to perform a desired process, for example, execute a software routine in the device including the touch screen. Accordingly, touch screens may function as a combination of general display panels and/or touch panels. Such touch panels may include resistive overlay type touch panels, capacitive overlay type touch panels, surface acoustic wave (SAW) type touch panels, infrared beam type touch panels, piezoelectric type touch panels or the like.

Most touch panels operate in response to touching the panel by, for example, a finger, a pen, a stylus or the like. Accordingly, in a resistive overlay type touch panels, upper and lower conductive layers thereof may be damaged by an external pressure. In addition, such touch panels have a small size of 10 inches or less. Large-sized touch panels which may be used in a large-sized screen may not function efficiently due to a line resistance and parasitic resistance. Therefore, touch panels are currently used in small-sized and/or medium-sized display devices such as general desktop computers, laptop computers, or portable devices such as mobile phones and navigation devices, for example. As a size of the display increases, a distance between a user and the display also increases, and it may, therefore, be difficult to use touch panels in the displays.

Currently, optical touch panels have been proposed, and such optical touch panels may function by sensing light instead of sensing a touch of a finger or pen. In order to realize such optical touch panel, a relatively small sized light sensing device for sensing light is required. Also, image acquisition apparatuses such as complimentary metal oxide semiconductor (CMOS) image sensors or charge coupled devices (CCDs) require such a light sensing device for acquiring an image. Examples of the light sensing device that is generally used may include a photodiode having a PN junction structure of a semiconductor such as silicon. However, it is also difficult to increase sizes of optical touch panels and image acquisition apparatuses due to complex circuit structures.

SUMMARY

According to example embodiments, a light sensing circuit includes a light-sensitive oxide semiconductor transistor including a channel layer of a light-sensitive oxide semiconductor, wherein the light-sensitive oxide semiconductor transistor is configured as a light sensing device that senses light and as a driving circuit that outputs data in response to the sensed light.

According to example embodiments, the light sensing circuit further includes a row selection line supplying a row selection signal to a gate of the light-sensitive oxide semiconductor transistor; a driving voltage line supplying a driving voltage to a drain of the light-sensitive oxide semiconductor transistor; and a data line connected to a source of the light-sensitive oxide semiconductor transistor and outputting data.

According to example embodiments, the row selection signal supplied to the gate of the light-sensitive oxide semiconductor transistor through the row selection line is one of a group consisting of a first voltage signal having a voltage lower than a first threshold voltage of the light-sensitive oxide semiconductor transistor and a second voltage signal having a voltage between the first threshold voltage of the light-sensitive oxide semiconductor transistor and a second threshold voltage, and the first threshold voltage is a threshold voltage of the light-sensitive oxide semiconductor transistor when light is incident thereon and the second threshold voltage is a threshold voltage of the light-sensitive oxide semiconductor transistor when light is not incident thereon.

According to example embodiments, the light sensing circuit further includes a row selection line supplying a row selection signal to a gate and a drain of the light-sensitive oxide semiconductor transistor; and a data line connected to a source of the light-sensitive oxide semiconductor transistor and outputting data.

According to example embodiments, the row selection signal supplied to the gate of the light-sensitive oxide semiconductor transistor through the row selection line is one of a group consisting of a first voltage signal having a voltage lower than a first threshold voltage of the light-sensitive oxide semiconductor transistor and a second voltage signal having a voltage between the first threshold voltage of the light-sensitive oxide semiconductor transistor and a second threshold voltage, and the first threshold voltage is a threshold voltage of the light-sensitive oxide semiconductor transistor when light is incident therein and the second threshold voltage is a threshold voltage of the light-sensitive oxide semiconductor transistor when light is incident thereon.

According to example embodiments, the light-sensitive oxide semiconductor transistor includes a substrate; an insulating layer on the substrate; a gate on at least a portion of the insulating layer; a gate insulating film on the insulating layer and the gate, the gate insulating film surrounding the gate; the channel layer on the gate insulating film; a source and a drain at least partially overlapping the sides of the channel layer; and a transparent insulating layer covering at least one of the source, the drain, and the channel layer.

According to example embodiments, the light-sensitive oxide semiconductor transistor further includes a first conductive plug electrically connected to the source through the transparent insulating layer; a first contact on the transparent insulating layer and electrically connected to the first conductive plug; a second conductive plug electrically connected to the drain through the transparent insulating layer; and a second contact on the transparent insulating layer and electrically connected to the second conductive plug.

According to example embodiments, the light-sensitive oxide semiconductor transistor includes a substrate; the channel layer on the substrate; a gate insulating film on at least a portion of the channel layer; a gate on the gate insulating film; a source and a drain on the channel layer and distant from the sides of the gate; and a transparent insulating layer covering at least one of the gate, the source, and the drain.

According to example embodiments, the light-sensitive oxide semiconductor includes InZnO (IZO), GaInZnO (Gallium Indium Zinc Oxide (GIZO)), or ZnO in which at least one of In and Hf is contained, as the channel layer.

According to example embodiments, an image acquisition apparatus includes the light sensing circuit in at least one pixel of the image acquisition apparatus.

According to example embodiments, a remote optical touch panel includes a light sensing panel including a plurality of light sensing pixels configured to sense incident light; a row scanner configured to selectively provide a first voltage or a second voltage different from the first voltage to at least one light sensing pixel of the light sensing panel through a row selection line; an analog-to-digital (A/D) converter configured to convert analog signals output from the light sensing panel into digital signals; and a column scanner configured to select an output from at least one light sensing pixel of the plurality of the light sensing pixel in a desired column, wherein at least one of the light sensing pixels includes the light sensing circuit.

According to example embodiments, the light sensing panel includes a plurality of row selection lines in a row direction, and a plurality of driving voltage lines and a plurality of data lines each in a column direction.

According to example embodiments, the plurality of row selection lines are connected to the row scanner.

According to example embodiments, the light sensing panel further includes a bias transistor at an end of each data line.

According to example embodiments, the row scanner selectively supplies a first voltage or a second voltage to the plurality of row selection lines, wherein the first voltage is lower than a first threshold voltage of the light-sensitive oxide semiconductor transistor, the second voltage is between a first threshold voltage and a second threshold voltage of the light-sensitive oxide semiconductor transistor, and the first threshold voltage is a threshold voltage of the light-sensitive oxide semiconductor transistor when light is incident thereon, and the second threshold voltage is a threshold voltage of the light-sensitive oxide semiconductor transistor when light is not incident thereon.

According to example embodiments, the row scanner supplies the second voltage to only one selected row selection line and provides the first voltage to the remaining row selection lines.

According to example embodiments, the remote optical touch panel includes a buffer configured to temporarily store digital output signals from the A/D converter.

According to example embodiments, an optical touch screen device includes the remote optical touch panel; a display device displaying an image; and a light source providing an optical signal incident on the remote optical touch panel.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
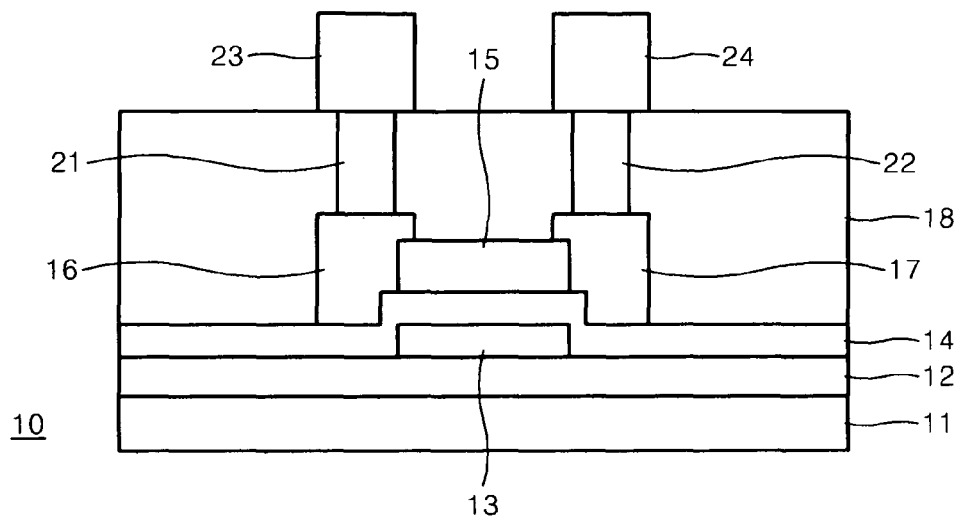
FIG. 1 is a cross-sectional view of a light-sensitive oxide semiconductor transistor used as an light sensing device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A light-sensitive oxide semiconductor transistor includes a light sensitive oxide semiconductor as a channel material. For example, ZnO-based material such as InZnO (IZO) and/or GaInZnO (Gallium Indium Zinc Oxide (GIZO)), or an oxide semiconductor material, in which at least one of In and/or Hf is contained in ZnO, may be used as a channel material. Since a threshold voltage of a light-sensitive oxide semiconductor transistor changes according to a wavelength or amount of incident light, the light-sensitive oxide semiconductor transistor may be used as a light sensing device.

FIG. 1 is a cross-sectional view of a light-sensitive oxide semiconductor transistor 10 used as a light sensing device according to example embodiments. Referring to FIG. 1, the light-sensitive oxide semiconductor transistor 10 may include a substrate 11, an insulating layer 12 formed on the substrate 11, a gate 13 disposed (for example, partially) on the insulating layer 12, an insulating film 14 formed on the insulating layer 12 and the gate 13 so as to surround the gate 13, a channel layer 15 disposed on the gate insulating film 14, a source 16 and a drain 17 formed to cover both sides of the channel layer 15, and a transparent insulating layer 18 covering the source 16, the drain 17, and the channel layer 15. Also, the light-sensitive oxide semiconductor transistor 10 may further include a first conductive plug 21, a first contact 23, a second conductive plug 22, and a second contact 24. The first conductive plug 21 is electrically connected to the source 16 through the transparent insulating layer 18, the first contact 23 is formed on the transparent insulating layer 18 and electrically contacts the first conductive plug 21, the second conductive plug 22 is electrically connected to the drain 17 through the transparent insulating layer 18, and the second contact 24 formed on the transparent insulating layer 18 and electrically contacts the second conductive plug 22.

The substrate 11 may be formed of a material such as glass or silicon or the like. The insulating layer 12, the gate insulating film 14, and the transparent insulating layer 18 may be formed of, for example, $SiO_2$. If the substrate 11 is formed of an insulating material, the insulating layer 12 formed on the substrate 11 may be omitted. Also, the gate 13, the source 16, and the drain 17 may be formed of a conductive metal and/or a conductive metal oxide. For example, if the light-sensitive oxide semiconductor transistor 10 is used in an optical touch panel attached to a display panel, the gate 13, the source 16, and the drain 17 may be formed of a transparent conductive material such as ITO. However, if the light-sensitive oxide semiconductor transistor 10 is not required to be transparent, the substrate 11, the insulating layer 12, the gate 13, the gate insulating film 14, the source 16, and the drain 17 may not be transparent. In this case, only the insulating layer 18 may be transparent so as to pass light to the channel layer 15. According to example embodiments, only a portion of the insulating layer 18 may be transparent so as to pass light. As described above, the channel layer 15 may be formed of an optical sensitive oxide semiconductor material. For example, the channel layer 15 may be formed of, for example, ZnO-based material such as InZnO (IZO) or GaInZnO (Gallium Indium Zinc Oxide (GIZO)), and/or an oxide semiconductor material, in which at least one of In and Hf is contained in ZnO.

Figure 2:
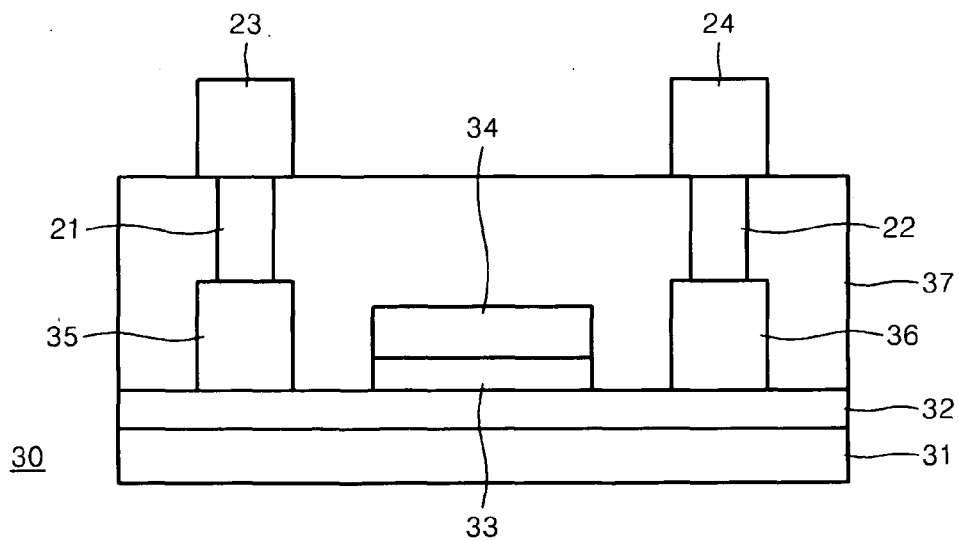
FIG. 2 is a cross-sectional view of a light-sensitive oxide semiconductor transistor used as an light sensing device according to example embodiments.

In FIG. 1, the light-sensitive oxide semiconductor transistor 10 has a bottom gate structure including a gate disposed below a channel. However, a light-sensitive oxide semiconductor transistor having a top gate structure may also be used to form a light sensing device. FIG. 2 is a cross-sectional view of a light-sensitive oxide semiconductor transistor 30 having a top gate structure.

Referring to FIG. 2, the light-sensitive oxide semiconductor transistor 30 having the top gate structure may include a substrate 31, a channel layer 32 formed on the substrate 31, a gate insulating film 33 disposed (for example, partially disposed) at the center of the channel layer 32, a gate 34 formed on the gate insulating film 33, a source 35 and a drain 36 each of which is spaced apart from the both sides of the gate 34 on the channel layer 32, and a transparent insulating layer 37 covering the gate 34, the source 35 and the drain 36. In the light-sensitive oxide semiconductor transistor 30 having the top gate structure illustrated in FIG. 2, the gate 34, the source 35 and the drain 36 may be formed of a transparent conductive material such as ITO so that light may be incident onto the channel layer 32. Also, the light-sensitive oxide semiconductor transistor 30 of FIG. 2 may further include the first conductive plug 21, the first contact 23, the second conductive plug 22, and the second contact 24.

Figure 3:
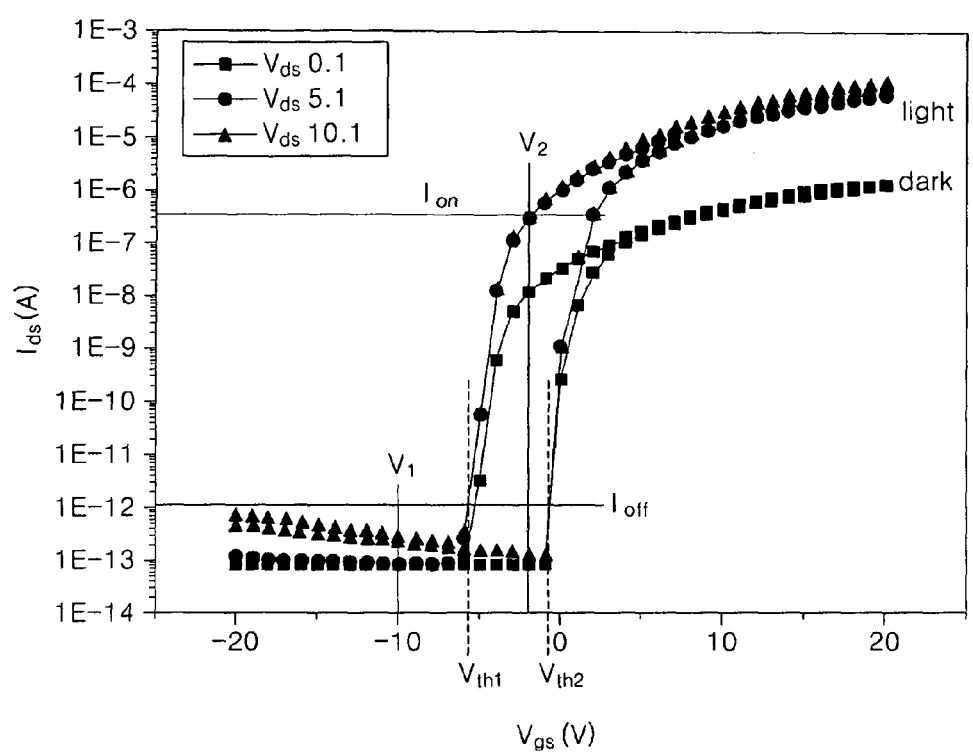
FIG. 3 is a graph showing operational characteristics of the light-sensitive oxide semiconductor transistors of FIGS. 1 and 2.

FIG. 3 is a graph showing example operational characteristics of the light-sensitive oxide semiconductor transistors 10 and 30 of FIGS. 1 and 2. In FIG. 3, drain currents against a gate voltage ($I_{ds}$-$V_{gs}$) of the light-sensitive oxide semiconductor transistors 10 and 30 are shown when light is absent (Dark) and light is present (Light). Referring to FIG. 3, in the presence of light, a threshold voltage of the light-sensitive oxide semiconductor transistors 10 and 30 moves in a negative direction. In particular, a ratio ($I_{ON}/I_{OFF}$) of the drain current in the light-sensitive oxide semiconductor transistors 10 and 30 in the presence and absence of light is relatively high at about 5.2 ($\log_{10}(10^{-7.2}/10^{-12})$) at a specific gate voltage (in FIG. 3, voltage corresponding to a threshold voltage when light is not applied). For reference, a current ratio ($I_{ON}/I_{OFF}$) of a silicon photodiode used as a light sensing device is 3 in the presence and absence of light. Accordingly, photosensitivity of the light-sensitive oxide semiconductor transistors 10 and 30 using the light-sensitive oxide semiconductor is around 200~3,000 times greater than that of a conventional silicon photodiode.

As the photosensitivity of the light-sensitive oxide semiconductor transistors 10 and 30 is high, the light-sensitive oxide semiconductor transistors 10 and 30 may be used as light sensing device so that a pixel structure of pixels may be relatively simplified. In a conventional silicon photodiode, a current ratio is relatively small. Accordingly, charges generated from the photodiode when light is incident thereon are accumulated in a capacitor for a desired/predetermined amount of time and then signal(s) based on the light intensity are generated from the charges accumulated in the capacitor. In this regard, separate data output circuit and/or switching driving circuit are required to convert the charges accumulated in the capacitor into light intensity signals and to output the signals. Accordingly, a conventional photodiode, a capacitor, and/or at least one thin film transistor may be included in each pixel. In general, in order to amplify and output signals with relatively less noise, three to five thin film transistors are used in one pixel. However, in the light-sensitive oxide semiconductor transistors 10 and 30 of FIGS. 1 and 2, photosensitivity thereof is very high and thus it is not required to accumulate charges in a capacitor for a desired/predetermined time. Also, unlike the conventional photodiode, the light-sensitive oxide semiconductor transistors 10 and 30 may perform a switching function, and thus, may not require a separate data output circuit and/or switching driving circuit.

Figure 4:
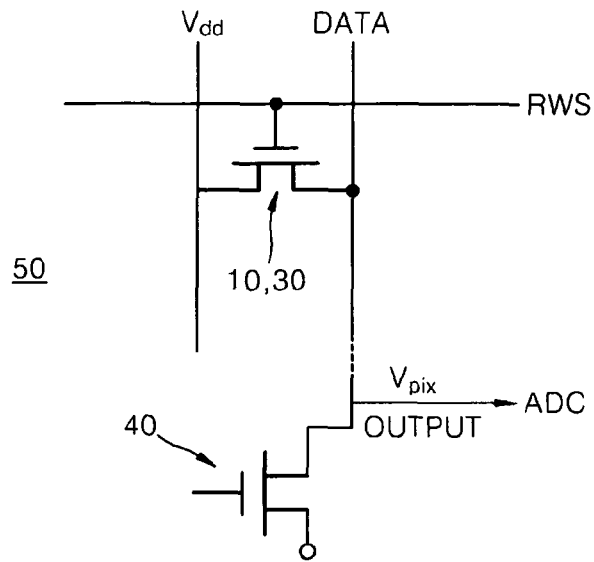
FIG. 4 is a circuit diagram of an light sensing circuit according to example embodiments.

FIG. 4 is a circuit diagram of a light sensing circuit 50 according to example embodiments. Referring to FIG. 4, the light sensing circuit 50 may include only one of the light-sensitive oxide semiconductor transistors 10 and 30 in each pixel. A row selection line RWS is connected to the gate of the light-sensitive oxide semiconductor transistor 10, 30, a driving voltage line ($V_{dd}$) is connected to the drain of the light-sensitive oxide semiconductor transistor 10, 30, and data line DATA is connected to the source of the light-sensitive oxide semiconductor transistor 10, 30. In FIG. 4, only the light sensing circuit 50 for one pixel is illustrated for convenience of description. However, as will be described with reference to FIG. 9, a plurality of light sensing circuits 50 for a plurality of pixels may be arranged along a plurality of row selection lines RWS and a plurality of data lines DATA. Also, a bias transistor 40 may be further disposed at one end of the data line DATA. The bias transistor 40 may function as an output load for outputting a signal. An output line OUTPUT is connected to an analog-to-digital converter (hereinafter, referred to as an A/D converter (ADC)), which will be described later.

Figure 5:
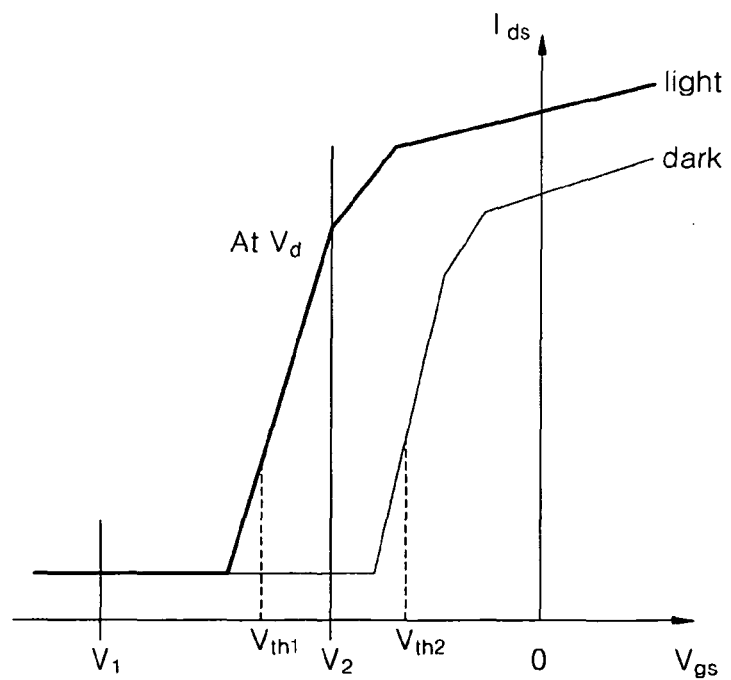
FIG. 5 is a graph showing operational characteristics of the light-sensitive oxide semiconductor transistors used in the light sensing circuit of FIG. 4.

FIG. 5 is a graph showing example operational characteristics of the light-sensitive oxide semiconductor transistors 10 and 30 used in the light sensing circuit 50 of FIG. 4. As shown in FIG. 5, in the light-sensitive oxide semiconductor transistors 10 and 30 used in the light sensing circuit 50 of FIG. 4, a first threshold voltage $V_{th1}$ when light is applied, and a second threshold voltage $V_{th2}$ when light is not applied, are negative voltages. While a first voltage $V_1$ that is lower than the first threshold voltage $V_{th1}$ is applied to the row selection line RWS, the light-sensitive oxide semiconductor transistors 10 and 30 are always in an OFF state regardless of light appliance and a current does not flow from a drain to a source. On the other hand, while a second voltage $V_2$ between the first threshold voltage $V_{th1}$ and the second threshold voltage $V_{th2}$ is applied to the row selection line RWS, the light-sensitive oxide semiconductor transistors 10 and 30 are in an ON state when light is applied thereto, and are in an OFF state when light is not applied thereto. When light is applied to the light-sensitive oxide semiconductor transistors 10 and 30, a current flows from the drain to the source. An amount of current may be in proportion to an amount/intensity of incident light. In order to improve the photosensitivity, the second voltage $V_2$ may be relatively closer to the second threshold voltage $V_{th2}$ between the first threshold voltage $V_{th1}$ and the second threshold voltage $V_{th2}$. Such a current may function as a signal including information about light amount/intensity and may be output to the output line OUTPUT through the data line DATA. Accordingly, when the second voltage $V_2$, functioning as a row selection signal, is provided (for example, sequentially) to a plurality of row selection lines RWS, pixels to which light is applied may be identified from among pixels arranged in specific rows.

As described above, the light sensing circuit 50 according to example embodiments may sense light and output data by using only one of the light-sensitive oxide semiconductor transistors 10 and 30. That is, the light-sensitive oxide semiconductor transistors 10 and 30 may function as a light sensing device and a driving circuit. Accordingly, as illustrated in FIG. 4, the light sensing circuit 50 having a relatively simple structure may be provided.

Figure 6:
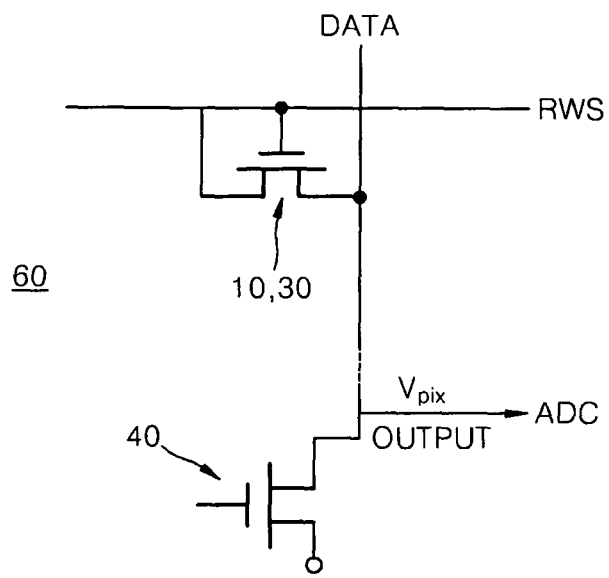
FIG. 6 is a circuit diagram of a light sensing circuit according to example embodiments.
Figure 7:
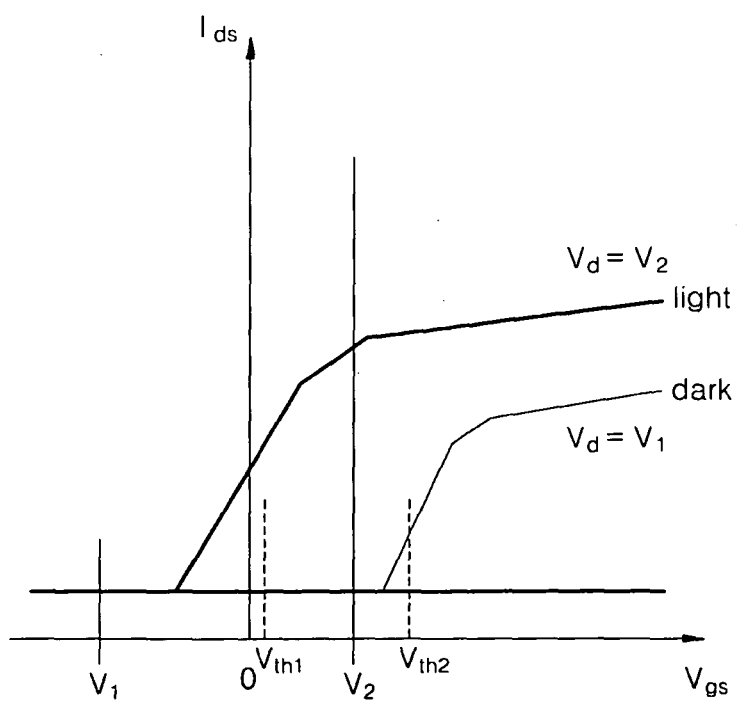
FIG. 7 is a graph showing operational characteristics of the light-sensitive oxide semiconductor transistors used in the light sensing circuit of FIG. 6.

FIG. 6 is a circuit diagram of a light sensing circuit 60 according to example embodiments and FIG. 7 is a graph showing operational characteristics of the light-sensitive oxide semiconductor transistors 10, 30 used in the light sensing circuit 60 of FIG. 6. As shown in FIG. 7, in the light-sensitive oxide semiconductor transistors 10, 30 used in the light sensing circuit 60 of FIG. 6, a first threshold voltage $V_{th1}$ when light is applied is a negative voltage, and a second threshold voltage $V_{th2}$ when light is not applied is a positive voltage. Such threshold voltage characteristics may be selected according to, for example, a material of the channel layer 15. When the second threshold voltage $V_{th2}$ is a positive voltage, a second voltage $V_2$ provided to the gate of the light-sensitive oxide semiconductor transistor 10, 30 through the row selection line RWS may be a positive voltage. In this case, a separate driving voltage $V_{dd}$ is not applied to the drain of the light-sensitive oxide semiconductor transistor 10, 30 and the second voltage $V_2$ applied to the gate may be used as a driving voltage. Accordingly, the light sensing circuit 60 of FIG. 6 does not include the driving voltage $V_{dd}$ line and the row selection line RWS is connected to the gate and drain of the light-sensitive oxide semiconductor transistor 10, 30. Other elements and operations thereof in the light sensing circuit 60 of FIG. 6 are the same as those described with respect to the light sensing circuit 50 of FIG. 4.

Figure 8:
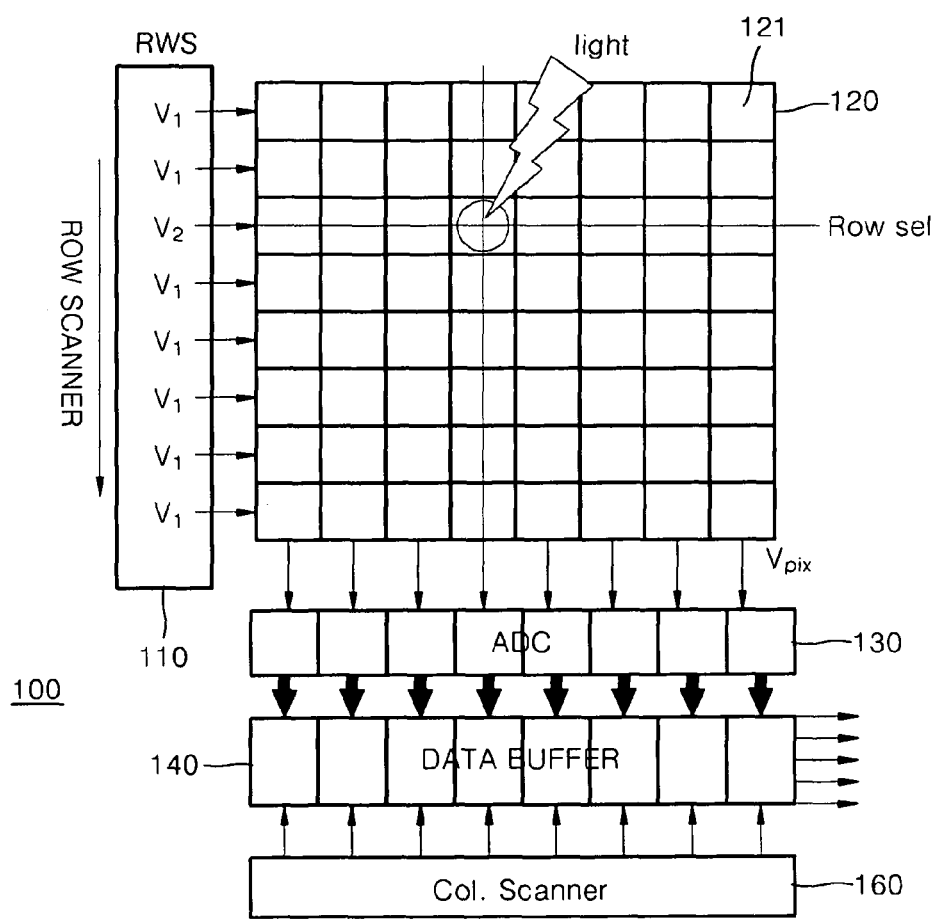
FIG. 8 is a block diagram of a remote optical touch panel using an light sensing circuit according to example embodiments.

The light sensing circuits 50 and 60 may be used in a pixel structure of a remote optical touch panel and/or an image acquisition apparatus. FIG. 8 is a block diagram of a remote optical touch panel 100 including the light sensing circuits 50, 60 according to example embodiments. Referring to FIG. 8, the remote optical touch panel 100 according to example embodiments may include a light sensing panel 120, a row scanner 110, an A/D converter 130, a buffer 140, and a column scanner 160. The light sensing panel 120 senses incident light, the row scanner 110 selectively provides the first voltage $V_1$ and/or the second voltage $V_2$ to the light sensing panel 120 through the row selection line RWS, the A/D converter 130 converts an analog output signal from the light sensing panel 120 into a digital signal, the buffer 140 temporarily stores the digital signal, and the column scanner 160 selects an output from a light sensing pixel 121 of a selected column(s). In order to sense incident light, the light sensing panel 120 may have a plurality of light sensing pixels 121 arranged in the form of an array. The light sensing pixels 121 may each include the light sensing circuit 50 or 60 of FIGS. 4 and 6.

Figure 9:
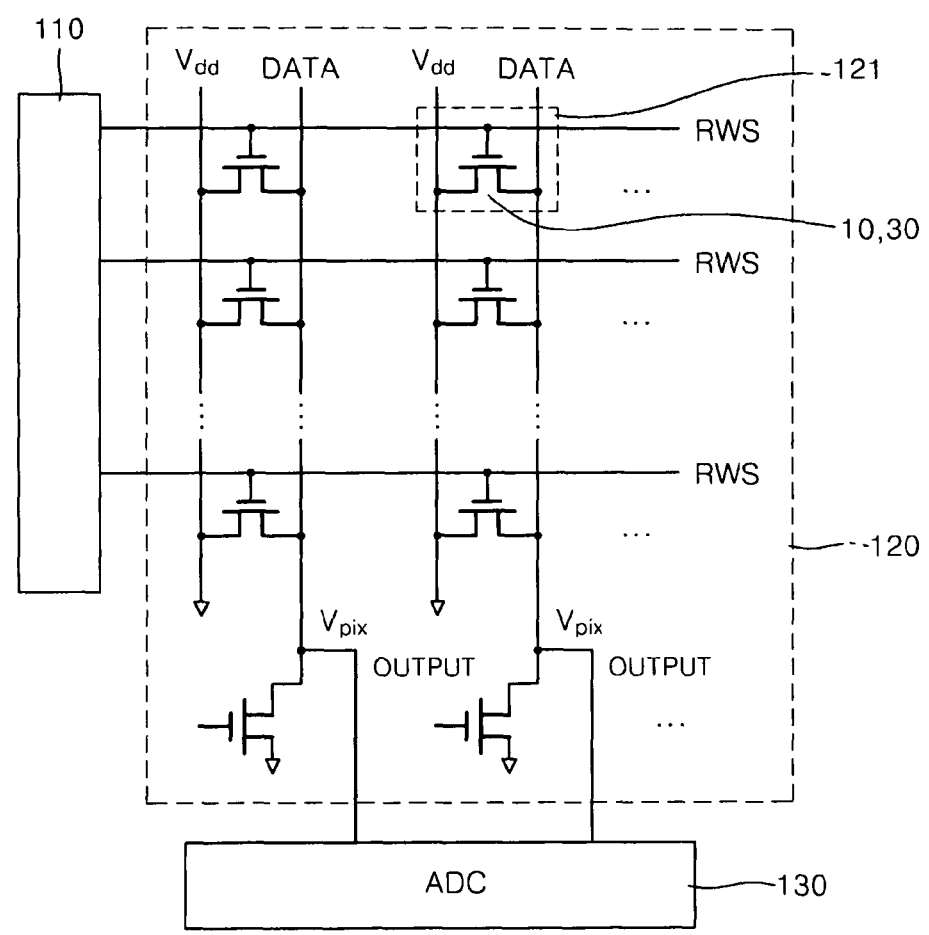
FIG. 9 is a circuit diagram of an light sensing panel of FIG. 8.

FIG. 9 is a circuit diagram of the light sensing panel 120 of FIG. 8. Referring to FIG. 9, the light sensing pixels 121 each include the light sensing circuits 50 illustrated in FIG. 4. However, the light sensing circuits 60 of FIG. 6 may also be used in each of the light sensing pixels 121, instead of the light sensing circuits 50 illustrated in FIG. 4. Alternatively, light sensing circuits 60 and 50 may both be used, with some of the light sensing pixels including the light sensing circuit 50 and the remainder including the light sensing circuit 60. In FIG. 9, the light sensing panel 120 includes a plurality of row selection lines RWS arranged along a row direction, and a plurality of driving voltage $V_{dd}$ lines and a plurality of data lines DATA each arranged along a column direction. The plurality of row selection lines RWS are connected to the row scanner 110. Also, the bias transistors 40 may be disposed at each end of the data lines DATA. Outputs of the data lines DATA are biased by the bias transistors 40 and are provided to the A/D converter 130 through each output line OUTPUT.

Figure 10:
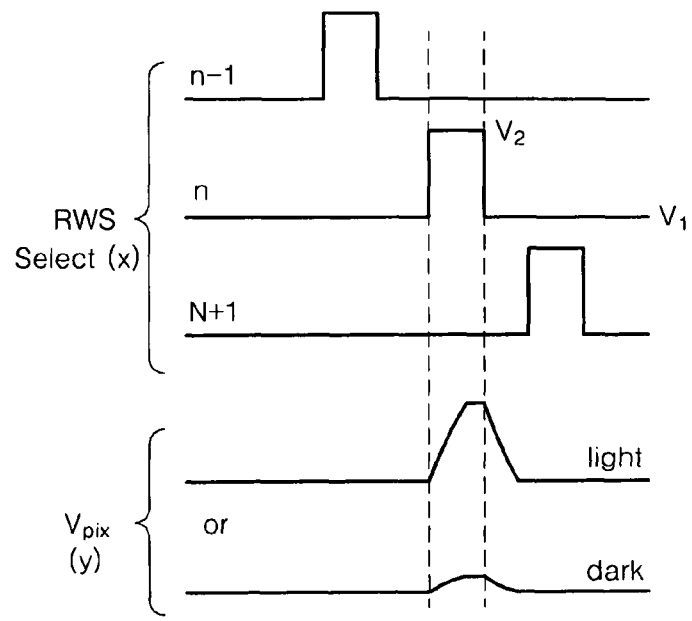
FIG. 10 is a timing diagram schematically illustrating operation of the remote optical touch panel of FIG. 8.

FIG. 10 is an example timing diagram illustrating an operation of the remote optical touch panel 100 of FIG. 8. Referring to FIG. 10, the row scanner 110 may selectively provide the first voltage $V_1$ and/or the second voltage $V_2$ to the plurality of row selection lines RWS. More specifically, the row scanner 110 may provide the second voltage $V_2$ as a row selection signal to one selected row selection line RWS and may provide the first voltage $V_1$ to the remaining row selection lines RWS. For example, as illustrated in FIG. 10, the second voltage $V_2$ may be sequentially provided to each of the row selection lines RWS from the upper side to the lower side. That is, while the second voltage $V_2$ is applied to the $n^{th}$ row selection line RWS, the first voltage $V_1$ is applied to the $n-1^{th}$ and $n+1^{th}$ row selection lines RWS. Then, the second voltage $V_2$ is applied to the $n+1^{th}$ row selection line RWS and the first voltage $V_1$ is applied to the $n-1^{th}$ and $n^{th}$ row selection lines RWS. Then, data may be output from the light-sensitive oxide semiconductor transistors 10, 30 connected to the selected row selection line RWS.

The outputs from each of the light-sensitive oxide semiconductor transistors 10, 30 are provided to the A/D converter 130 through the output lines OUTPUT connected to the corresponding data lines DATA. Signals from the light-sensitive oxide semiconductor transistors 10, 30 as illustrated in the bottom of FIG. 10 have a great intensity when light is applied thereto, and small intensity, nearly 0, when light is not applied thereto. The signals are analog signals and thus are converted into digital signals by the A/D converter 130. Digital outputs converted by the A/D converter 130 are provided to and stored in the buffer 140 and then digital signals in specific columns are output according to selection by the column scanner 160. For example, in FIG. 8, a signal of the light sensing pixel 121 in a third row and a fourth column is selected and output from the buffer 140.

Figure 11:
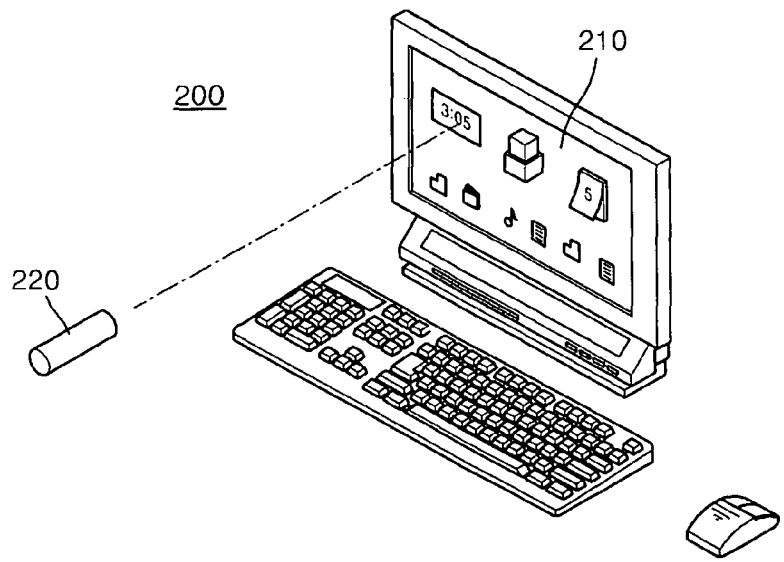
FIG. 11 is a conceptual view schematically illustrating remotely controlling of a display device including the remote optical touch panel of FIG. 8 by using a light source device.

FIG. 11 is an example view illustrating remotely controlling a display device 210 including the remote optical touch panel 100 of FIG. 8 by using a light source device 220. FIG. 11 illustrates an optical touch screen device 200 including the display device 210 that has the remote optical touch panel 100. In the optical touch screen device 200, when, for example, the light source device 220 such as a laser pointer irradiates light on the display device 210, the light sensing pixels 121 arranged in the remote optical touch panel 100 sense light. Accordingly, an effect similar to touching a touch screen using, for example, a finger, a pen, a stylus or the like may be obtained.

As described above, the light sensing circuits 50 and 60 including the light-sensitive oxide semiconductor transistors 10 and 30 are used in the remote optical touch panel 100. However, the light sensing circuits 50 and 60 may be used not only in the remote optical touch panel 100 but also in any device that senses light. For example, the light sensing circuits 50 and 60 may be used in an image acquisition apparatus such as a CMOS image sensor or a CCD or the like.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:
1. A light sensing circuit, comprising:
a light-sensitive oxide semiconductor transistor including a channel layer of a light-sensitive oxide semiconductor, a row selection line supplying a row selection signal to a gate of the light-sensitive oxide semiconductor transistor;
a driving voltage line supplying a driving voltage to a drain of the light-sensitive oxide semiconductor transistor; and
a data line connected to a source of the light-sensitive oxide semiconductor transistor and outputting data, the light-sensitive oxide semiconductor transistor being configured to operate as a light sensing device that senses light incident on the transistor and as a switching circuit that outputs data in response to the sensed incident light without storing charges associated with the incident light, in a storage element, wherein,
when the gate voltage is a first voltage, the channel layer is in a non-conducting state irrespective of an intensity or amount of the incident light and no data is outputted, and
when the gate voltage is a second voltage, the channel layer is in a conducting state when light is incident on the transistor and data is outputted as current corresponding to an intensity or an amount of the incident light.

2. The light sensing circuit of claim 1, wherein the first voltage is less than a first threshold voltage, the first threshold voltage being a threshold voltage of the light-sensitive oxide semiconductor transistor when light is incident thereon, and
the second voltage is between the first threshold voltage and a second threshold voltage, the second threshold voltage being a threshold voltage of the light-sensitive oxide semiconductor transistor when light is not incident thereon.

3. The light sensing circuit of claim 1, wherein the light-sensitive oxide semiconductor comprises InZnO (IZO), GaInZnO (Gallium Indium Zinc Oxide (GIZO)), or ZnO in which at least one of In and Hf is contained, as the channel layer.

4. The light sensing circuit of claim 1, wherein:
the current flows between the drain and source when light is incident on the transistor, and
an amount or an intensity of the incident light is determined based on an amount of the current flowing between the drain and source when light is incident on the transistor.

5. The light sensing circuit of claim 1, wherein the first and second voltages are negative voltages.

6. The light sensing circuit of claim 1, wherein the light-sensitive oxide semiconductor transistor outputs data directly in response to the sensed incident light.

7. The light sensing circuit of claim 1, wherein the light-sensitive oxide semiconductor transistor comprises:
a substrate;
an insulating layer on the substrate;
the gate on at least a portion of the insulating layer;
a gate insulating film on the insulating layer and the gate, the gate insulating film surrounding the gate;
the channel layer on the gate insulating film;
the source and the drain at least partially overlapping the sides of the channel layer; and
a transparent insulating layer covering at least one of the source, the drain, and the channel layer.

8. The light sensing circuit of claim 7, wherein the light-sensitive oxide semiconductor transistor further comprises:
a first conductive plug electrically connected to the source through the transparent insulating layer;
a first contact on the transparent insulating layer and electrically connected to the first conductive plug;
a second conductive plug electrically connected to the drain through the transparent insulating layer; and a second contact on the transparent insulating layer and electrically connected to the second conductive plug.

9. The light sensing circuit of claim 1, wherein the light-sensitive oxide semiconductor transistor comprises:
   a substrate;
   the channel layer on the substrate;
   a gate insulating film on at least a portion of the channel layer;
   the gate on the gate insulating film;
   the source and the drain on the channel layer and distant from the sides of the gate; and
   a transparent insulating layer covering at least one of the gate, the source, and the drain.

10. The light sensing circuit of claim 9, wherein the light-sensitive oxide semiconductor transistor further comprises:
    a first conductive plug electrically connected to the source through the transparent insulating layer;
    a first contact on the transparent insulating layer and electrically connected to the first conductive plug;
    a second conductive plug electrically connected to the drain through the transparent insulating layer; and
    a second contact on the transparent insulating layer and electrically connected to the second conductive plug.

11. A light sensing circuit, comprising:
    a plurality of light sensing pixels, each light sensing pixel including one light-sensitive oxide semiconductor transistor having a channel layer of a light-sensitive oxide semiconductor, the light-sensitive oxide semiconductor transistor being configured to operate as a light sensing device that senses light incident on the transistor and as a switching circuit that outputs data in response to the sensed incident light without storing charges associated with the incident light;
    a row selection line supplying gate voltage to a gate and a drain of the light-sensitive oxide semiconductor transistor; and
    a data line connected to a source of the light-sensitive oxide semiconductor transistor and outputting data, wherein,
    when gate voltage is a first voltage, the channel layer is in a non-conducting state irrespective of an intensity or amount of the incident light and no data is outputted, and
    when the gate voltage is a second voltage, the channel layer is in a conducting state when light is incident on the transistor and the data is outputted as a current corresponding to an intensity or amount of the incident light.

12. The light sensing circuit of claim 11, wherein the first voltage is less than a first threshold voltage, the first threshold voltage being a threshold voltage of the light-sensitive oxide semiconductor transistor when light is incident thereon, and
    the second voltage is between the first threshold voltage and a second threshold voltage, the second threshold voltage being a threshold voltage of the light-sensitive oxide semiconductor transistor when light is not incident thereon.

13. The light sensing circuit of claim 11, wherein the first voltage is a negative voltage and the second voltage is a positive voltage.

14. A remote optical touch panel, comprising:
    a light sensing panel including a plurality of light sensing pixels configured to sense incident light;
    a row scanner configured to selectively provide different voltages to at least one light sensing pixel of the light sensing panel through a row selection line;
    an analog-to-digital (A/D) converter configured to convert analog signals output from the light sensing panel into digital signals; and
    a column scanner configured to select an output from at least one light sensing pixel of the plurality of the light sensing pixel in a desired column, at least one of the light sensing pixels including a light sensing element, the light sensing element including:
      a light-sensitive oxide semiconductor transistor including a channel layer of a light-sensitive oxide semiconductor,
      a row selection line supplying a row selection signal to a gate of the light-sensitive oxide semiconductor transistor;
      a driving voltage line supplying a driving voltage to a drain of the light-sensitive oxide semiconductor transistor; and
      a data line connected to a source of the light-sensitive oxide semiconductor transistor and outputting data, the light-sensitive oxide semiconductor transistor being configured to operate as a light sensing device that senses light incident on the transistor and as a switching circuit that outputs data in response to the sensed incident light without storing charges associated with the incident light, in a storage element, wherein,
      when the gate voltage is a first voltage, the channel layer is in a non-conducting state irrespective of an intensity or amount of the incident light and no data is outputted, and
      when the gate voltage is a second voltage, the channel layer is in a conducting state when light is incident on the transistor and data is outputted as current corresponding to an intensity or an amount of the incident light.

15. The remote optical touch panel of claim 14 wherein the row selection line is connected to the row scanner.

16. The remote optical touch panel of claim 14, wherein the light sensing panel further comprises a bias transistor at an end of each data line.

17. The remote optical touch panel of claim of claim 14, further comprising a buffer configured to temporarily store digital output signals from the A/D converter.

18. The remote optical touch panel of claim 14, wherein the row scanner selectively supplies different voltages to the row selection line of each of the light sensing pixels,
    the first voltage is a threshold voltage of the light-sensitive oxide semiconductor transistor when light is incident thereon, and
    the second voltage is a threshold voltage of the light-sensitive oxide semiconductor transistor when light is not incident thereon.

19. The remote optical touch panel of claim 18, wherein the row scanner supplies the second voltage to only one selected row selection line and provides the first voltage to the remaining row selection lines.

* * * * *